US012606724B2

(12) United States Patent
Shin et al.

(10) Patent No.: US 12,606,724 B2
(45) Date of Patent: Apr. 21, 2026

(54) ELECTRICALLY CONDUCTIVE TAPE WITH MONOLAYERED CONDUCTIVE PRESSURE SENSITIVE ADHESIVE

(71) Applicant: 3M INNOVATIVE PROPERTIES COMPANY, St. Paul, MN (US)

(72) Inventors: Junbeom Shin, Hwaseong-Si (KR);
Jeongwan Choi, Suwon-Si (KR);
Jong-Pil Kim, Gyeonggi-do (KR)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 237 days.

(21) Appl. No.: 18/239,887

(22) Filed: Aug. 30, 2023

(65) Prior Publication Data

US 2024/0084176 A1     Mar. 14, 2024

Related U.S. Application Data

(60) Provisional application No. 63/405,038, filed on Sep. 9, 2022.

(51) Int. Cl.
*C09J 9/02* (2006.01)
*C09J 5/00* (2006.01)
(Continued)

(52) U.S. Cl.
CPC . *C09J 9/02* (2013.01); *C09J 5/00* (2013.01);
*C09J 7/21* (2018.01); *H01B 5/00* (2013.01);
(Continued)

(58) Field of Classification Search
CPC ......... C09J 9/02; C09J 5/00; C09J 7/21; C09J
2203/326; C09J 2301/1242;
(Continued)

(56) References Cited

U.S. PATENT DOCUMENTS

2019/0316008 A1    10/2019   Choi et al.

FOREIGN PATENT DOCUMENTS

KR        20140141451 A    12/2014

OTHER PUBLICATIONS

English Translation for Gu (CN 104845547 A) (Year: 2015).*
(Continued)

*Primary Examiner* — Nathan L Van Sell
(74) *Attorney, Agent, or Firm* — Jonathan L. Tolstedt

(57) ABSTRACT

An electrically conductive bonding tape includes a conductive first film between, and bonded to, conductive first and second adhesive layers. The first film and the first and second adhesive layers are conductive at least along a thickness direction of the bonding tape. Each of the first and second adhesive layers includes conductive particles dispersed substantially as a single layer in a substantially insulative adhesive material. The plurality of conductive particles in each of the first and second adhesive layers has an average particle size $P_{av}$ and a standard of deviation $P_{sd}$, such that $P_{sd}/P_{av}$ is less than about 0.2. Each of the first and second adhesive layers has an average thickness of no more than about 15% greater than the average particle size of the particles in the adhesive layer. An average surface roughness of opposing major first and second surfaces of the first film is less than 10 microns.

20 Claims, 3 Drawing Sheets

(51) Int. Cl.

| | |
|---|---|
| *C09J 7/21* | (2018.01) |
| *H01B 5/00* | (2006.01) |
| *H05K 3/20* | (2006.01) |

(52) U.S. Cl.
CPC .......... *H05K 3/20* (2013.01); *C09J 2203/326* (2013.01); *C09J 2301/1242* (2020.08); *C09J 2301/408* (2020.08); *C09J 2400/166* (2013.01)

(58) Field of Classification Search
CPC ............ C09J 2301/408; C09J 2400/166; C09J 2301/124; C09J 7/38; C09J 2301/314; C09J 2301/302; C09J 2400/263; H01B 5/00; H05K 3/20; H05K 3/321; C08K 3/08
See application file for complete search history.

(56) References Cited

OTHER PUBLICATIONS

"3M™ Electrically Conductive Double-Sided Tape 9711SSeries", 3M Technical Data Sheet, 2021, pp. 1-5.
"3M™ Electrically Conductive Double-Sided Tapes 9701-50 and 9701-100", 3M Technical Data Sheet, 2023, pp. 1-4.

* cited by examiner

ELECTRICALLY CONDUCTIVE TAPE WITH MONOLAYERED CONDUCTIVE PRESSURE SENSITIVE ADHESIVE

SUMMARY

In some aspects of the present description, an electrically conductive bonding tape is provided, the electrically conductive bonding tape including an electrically conductive first film sandwiched between, and bonded to, electrically conductive first and second adhesive layers. Each of the first film and the first and second adhesive layers are electrically conductive at least along a thickness direction of the bonding tape. Each of the first and second adhesive layers includes a plurality of electrically conductive particles dispersed substantially as a single layer in a substantially electrically insulative adhesive material. The plurality of electrically conductive particles in each of the first and second adhesive layers has an average particle size $P_{av}$ and a standard of deviation $P_{sd}$, such that the ratio $P_{sd}/P_{av}$ is less than about 0.2. Each of the first and second adhesive layers has an average thickness of no more than about 15% greater than the average particle size of the particles in the adhesive layer. An average surface roughness of each of opposing major first and second surfaces of the first film is less than about 10 microns.

In some aspects of the present description, an electrically conductive bonding tape is provided, the electrically conductive bonding tape including an electrically conductive first film bonded to an electrically conductive first adhesive layer. Each of the first film and the first adhesive layer are electrically conductive at least along a thickness direction of the bonding tape. The first adhesive layer includes a plurality of electrically conductive particles dispersed substantially as a single layer in a substantially electrically insulative adhesive material. The plurality of electrically conductive particles in the first adhesive layer has an average particle size Pay and a standard of deviation $P_{sd}$, such that the ratio $P_{sd}/P_{av}$ is less than about 0.2. The first adhesive layer has an average thickness of no more than about 15% greater than the average particle size of the particles in the adhesive layer. An average surface roughness of each of opposing major first and second surfaces of the first film is less than about 10 microns. When the electrically conductive first adhesive layer bonds the electrically conductive bonding tape to a major surface of a stainless steel plate, the bonding tape forms a resistive contact with the stainless steel plate with a resistance value that changes by less than about 200% after repeatedly cycling the bonding tape and the stainless steel plate both between a lower temperature of no more than about zero degrees centigrade and a higher temperature of no less than about 40 degrees centigrade for at least 50 hours.

DETAILED DESCRIPTION

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

It is understood that reinforcing pressure sensitive adhesives (PSA) by fibers, film, or nonwovens makes handling of the tapes easier in processes such as converting, die-cutting, and bonding. Particularly, reinforcing electrically conductive pressure sensitive adhesive is important since the PSA includes conductive particles exposed on the adhesive surfaces. The exposed particles can disturb quick wet-out of the PSA on adherent surfaces, which may create issues handing the PSA in manufacturing processes.

As a result, most electrically conductive pressure sensitive adhesives for electronics applications are commercially available in forms of double coated fabric tapes which consist of electrically conductive woven fabric carriers and pressure sensitive adhesive containing metal particles coated on both sides of the fabric. The conductive fabrics not only make the double coated tapes electrically conductive in the plane, but they also reinforce the adhesive layer.

Figure 1:
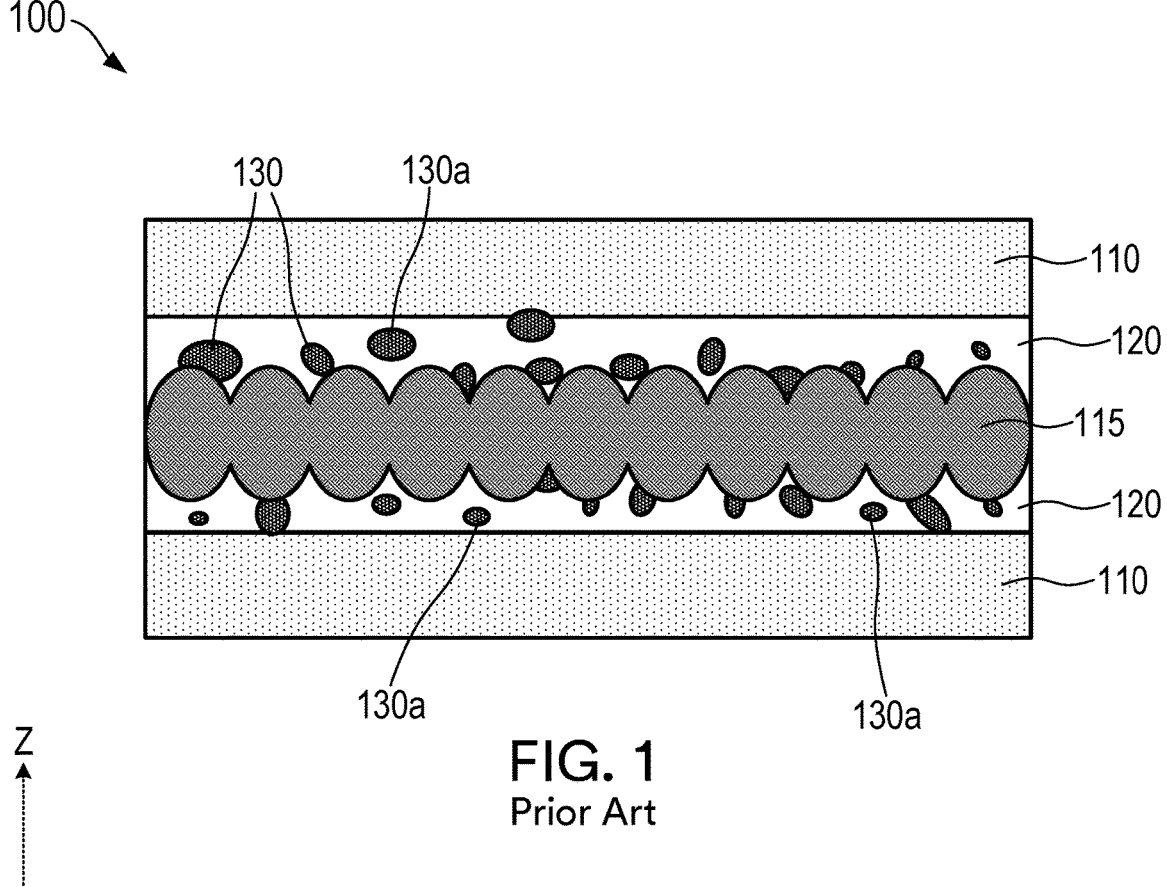
FIG. 1 is a side view of a double-sided, electrically conductive fabric tape typical of the prior art.

However, one disadvantage of using conductive fabrics which consist of conductive fibers is that the surfaces of the fabrics are not flat, and the rough surface makes the conductive particles in the adhesive layer isolated and many of the particles do not form conduction path through the adhesive. This is illustrated in FIG. 1, showing an implementation of a double-sided, electrically conductive fabric tape 100 typical of the prior art. This fabric tape 100, includes an electrically conductive fabric layer 115 which is sandwiched between two layers of pressure sensitive adhesive 120 loaded with metal particles 130. Optionally, this sandwich structure may be disposed between two release layers 110. One issue with this arrangement is that the surface of the conductive fabric 115 is typically rough, and not flat. Because of this rough surface, some of the conductive particles 130a become isolated and do not form part of the conduction path through the adhesive (i.e., they are not in contact with the conductive fabric tape 115).

Many such conventional conductive tapes show unstable electrical connections over time and the increase in resistance and/or passive intermodulation (PIM) of the tapes mainly occurs due to the pressure-sensitive adhesive layers of the tapes experiencing temperature and humidity changes (e.g., swelling, differential thermal expansion between the PSA and the particles, etc.) that disrupt the conductive grounding pathways. The temperature changes may cause thermal expansion and shrinkage of the PSA matrix which may change or damage metal particles in the adhesive leading to changes in resistance and PIM. Any change in metal-to-metal contacts can change the current flow of the grounding point and can lead to PIM and EMI noise and/or noise spikes related to the flow of current being re-initiated.

According to some aspects of the present description, to increase the conduction path in the electrically conductive pressure sensitive adhesive and to improve the electrical performance of the tapes, a new construction of electrically conductive fabric double-sided tapes may use flat conductive fabrics and conductive PSA with monolayered conductive particle construction. Many more of the particles in monolayered constructions will form conduction paths between the conductive fabric and the conductive adherent surface than would be the case for the prior art tapes. This increased number of conduction paths through the PSA improves the electrical performance of the tapes of the present description.

According to some aspects of the present description, an electrically conductive bonding tape includes an electrically conductive first film sandwiched between, and bonded to, electrically conductive first and second adhesive layers. In some embodiments, each of the first film and the first and second adhesive layers may be electrically conductive at least along a thickness direction (e.g., a z-axis of the bonding tape) of the bonding tape. In some embodiments, each of the first and second adhesive layers may include a plurality of electrically conductive particles (e.g., metal particles) dispersed substantially as a single layer in a substantially electrically insulative adhesive material. In some embodiments, the plurality of electrically conductive particles in each of the first and second adhesive layers having an average particle size P a y and a standard of deviation $P_{sd}$, $P_{sd}/P_{av}$ less than about 0.2, or less than about 0.17, or less than about 0.15, or less than about 0.12, or less than about 0.1.

In some embodiments, each of the first and second adhesive layers may have an average thickness of no more than about 15%, or about 12.5%, or about 10%, or about 7.5%, or about 5%, or about 2.5%, or about 2%, or about 1% greater than the average particle size of the particles in the adhesive layer. In some embodiments, an average surface roughness of each of opposing major first and second surfaces of the first film may be less than about 10 microns, or less than about 9 microns, or less than about 8 microns, or less than about 7 microns, or less than about 6 microns, or less than about 5 microns, or less than about 4 microns, or less than about 3 microns, or less than about 2 microns, or less than about 1 micron.

In some embodiments, the first film may include an electrically conductive fabric. In some such embodiments, the electrically conductive fabric may include a plurality of woven electrically conductive fibers. In other such embodiments, the electrically conductive fabric may include a plurality of non-woven electrically conductive fibers.

In some embodiments, the pluralities of electrically conductive particles in the first and second adhesive layers may have average particle sizes that are within 15%, or within 12.5%, or within 10%, or within 7.5%, or within 5%, or within 2.5% of each other. In some embodiments, the pluralities of electrically conductive particles in the first and second adhesive layers may have average particle sizes that are different by at least 15%, or at least 20%, or at least 25%, or at least 30%, or at least 35%, or at least 40%, or at least 45%, or at least 50%. In some embodiments, the particles in each of the pluralities of electrically conductive particles in the first and second adhesive layers may include one or more of silver, gold, aluminum and nickel.

In some embodiments, the average thickness of each of the first and second adhesive layers may be within about 15%, or within about 12.5%, or within about 10%, or within about 7.5%, or within about 5%, or within about 2.5%, or within about 2%, or within about 1% of the average particle size of the particles in the adhesive layer. In some embodiments, the average thickness of each of the first and second adhesive layers may be less than the average particle size of the particles in the adhesive layer.

In some embodiments, an electrical circuit may be formed by providing spaced apart first and second gold microstrips, placing a same stainless steel plate above the first and second gold microstrips, and disposing first and second electrically conductive bonding tapes (i.e., and of the conductive bonding tapes of the present description) between the stainless steel plate and the first and second gold microstrips. In some embodiments, the first and second electrically conductive bonding tapes may bond a same major surface of the stainless steel plate to the respective first and second gold microstrips.

In some embodiments, when first and second electric current signals having substantially equal respective intensities I1 and I2 and respective different frequencies F1 and F2 are simultaneously applied to the first gold microstrip, then an intermodulation current signal having a frequency F3 equal to nF1+mF2 with m and n being non-zero positive or negative integers, may be transmitted by the second gold microstrip having an intensity I3. In some embodiments, after repeatedly cycling the electrical circuit between a lower temperature of no more than about zero degrees, or no more than about −5 degrees, or no more than about −10 degrees, or no more than about −15 degrees, or no more than about −20 degrees centigrade and a higher temperature of no less than about 40 degrees, or no less than about 45 degrees, or no less than about 50 degrees, or no less than about 55 degrees, or no less than about 60 degrees centigrade for at least 50 hours, or at least 60 hours, or at least 70 hours, I3 may change by less than about 30 dB, or about 25 dB, or about 20 dB. In some embodiments, the electrical circuit may be cycled between the lower temperature and the higher temperature for at least 20 cycles, or at least 25 cycles, or at least 30 cycles. In some embodiments, each cycle may be at least 80 minutes, or at least 90, or at least 100 minutes, or at least 110 minutes, or at least 120 minutes in duration. In some embodiments, each cycle may be defined as about 70 minutes, or about 80 minutes, or about 90 minutes from the higher temperature down to the lower temperature, about 15 minutes, or about 18 minutes, or about 20 minutes dwell time at the lower temperature, about 10 minutes, or about 12 minutes, or about 15 minutes from the lower temperature back to the higher temperature, and about 15 minutes, or about 18 minutes, or about 20 minutes dwell time at the higher temperature.

In some embodiments, after holding the electrical circuit at a temperature of about 85 degrees centigrade at a relative humidity of about 85% for at least 50 hours, or at least 60 hours, or at least 70 hours, I3 may change by less than about 30 dB, or about 25 dB, or about 20 dB.

In some such embodiments, the first and second gold microstrips may be disposed on an electrically insulative common substrate. In some embodiments, each of the first and second electrically conductive bonding tapes may be narrower than the respective first and second gold microstrips by at least 10%, or at least 20%, or at least 50%, or at least 75%, or at least 100%. In some embodiments, each of the first and second electrically conductive bonding tapes may be substantially similar in width to the respective first and second gold microstrips.

In some embodiments, when the electrically conductive bonding tape is bonded to a major surface of a stainless steel plate, the bonding tape may form a resistive contact with the stainless steel plate with a resistance value that changes by less than about 200%, or about 150%, or about 100%, or about 50%, or about 25%, or about 10% after repeatedly cycling the bonding tape and the stainless steel plate both between a lower temperature of no more than about zero degrees, or no more than about −5 degrees, or no more than about −10 degrees, or no more than about −15 degrees, or no more than about −20 degrees centigrade and a higher temperature of no less than about 40 degrees, or no less than about 45 degrees, or no less than about 50 degrees, or no less than about 55 degrees, or no less than about 60 degrees centigrade for at least 50 hours, or at least 60 hours, or at least 70 hours. In some embodiments, the bonding tape and the stainless steel plate may be cycled between the lower temperature and the higher temperature for at least 20 cycles, or at least 25 cycles, or at least 30 cycles. In some embodiments, each cycle may be at least 80 minutes, or at least 90, or at least 100 minutes, or at least 110 minutes, or at least 120 minutes in duration. In some embodiments, each cycle may be defined as about 70 minutes, or about 80 minutes, or about 90 minutes from the higher temperature down to the lower temperature, about 15 minutes, or about 18 minutes, or about 20 minutes dwell time at the lower temperature, about 10 minutes, or about 12 minutes, or about 15 minutes from the lower temperature back to the higher temperature, and about 15 minutes, or about 18 minutes, or about 20 minutes dwell time at the higher temperature.

In some embodiments, the bonding tape may form a resistive contact with the stainless steel plate with a resistance value that changes by less than about 200%, or about 150%, or about 100%, or about 50%, or about 25%, or about 10% after holding the bonding tape and the stainless steel plate at about 85 degrees centigrade at a relative humidity of 85% for at least 50 hours, or at least 60 hours, or at least 70 hours.

In some embodiments, the electrically conductive first film and the electrically conductive first and second adhesive layers, in combination, may be disposed between, and releasably attached to, first and second release liners.

According to some aspects of the present description, an electrically conductive bonding tape includes an electrically conductive first film bonded to an electrically conductive first adhesive layer. In some embodiments, each of the first film and the first adhesive layer are electrically conductive at least along a thickness direction (e.g., a z-axis) of the bonding tape. In some embodiments, the first adhesive layer may include a plurality of electrically conductive particles dispersed substantially as a single layer in a substantially electrically insulative adhesive material. In some embodiments, the plurality of electrically conductive particles in the first adhesive layer may have an average particle size Pay and a standard of deviation P s d, such that the ratio $P_{sd}/P_{av}$ is less than about 0.2, or about 0.17, or about 0.15, or about 0.12, or about 0.1. in some embodiments, the first adhesive layer may an average thickness of no more than about 15%, or no more than about 12.5%, or no more than about 10%, or no more than about 7.5%, or no more than about 5%, or no more than about 2.5%, or no more than about 2%, or no more than about 1% greater than the average particle size of the particles in the adhesive layer. In some embodiments, an average surface roughness of each of opposing major first and second surfaces of the first film may be less than about 10 microns, or less than about 9 microns, or less than about 8 microns, or less than about 7 microns, or less than about 6 microns, or less than about 5 microns, or less than about 4 microns, or less than about 3 microns, or less than about 2 microns, or less than about 1 micron.

In some embodiments, when the electrically conductive first adhesive layer bonds the electrically conductive bonding tape to a major surface of a stainless steel plate, the bonding tape may form a resistive contact with the stainless steel plate with a resistance value that changes by less than about 200%, or 150%, or 100%, or 50%, or 25%, or 10% after repeatedly cycling the bonding tape and the stainless steel plate both between a lower temperature of no more than about zero, or no more than about −5, or no more than about −10, or no more than about −15, or no more than about −20 degrees centigrade and a higher temperature of no less than about 40 degrees, or no less than about 45 degrees, or no less than about 50 degrees, or no less than about 55 degrees, or no less than about 60 degrees centigrade for at least 50 hours, or at least 60 hours, or at least 70 hours. In some embodiments, the bonding tape may form a resistive contact with the stainless steel plate with a resistance value that changes by less than about 200%, or 150%, or 100%, or 50%, or 25%, or 10% after holding the bonding tape and the stainless steel plate both at a temperature of about 85 degrees centigrade at a relative humidity of 85% for at least 50 hours, or at least 60 hours, or at least 70 hours.

In some embodiments, the electrically conductive first film may further be bonded to an electrically conductive second adhesive layer opposite the first adhesive layer. In some embodiments, the second adhesive layer may be electrically conductive at least along the thickness direction of the bonding tape (e.g., a z-axis of the bonding tape). In some embodiments, the second adhesive layer may include a plurality of electrically conductive particles dispersed substantially as a single layer in a substantially electrically insulative adhesive material. In some embodiments, the plurality of electrically conductive particles in the second adhesive layer may have an average particle size P' a v and a standard of deviation $P'_{sd}$, $P'_{sd}/P'_{av}$ less than about 0.2, or less than about 0.17, or less than about 0.15, or less than about 0.12, or less than about 0.1. In some embodiments, the second adhesive layer may have an average thickness of no more than about 15%, or no more than about 12.5%, or no more than about 10%, or no more than about 7.5%, or no more than about 5%, or no more than about 2.5%, or no more than about 2%, or no more than about 1% greater than the average particle size of the particles in the adhesive layer.

Turning now to the figures, FIG. 1 is a side view of a double-sided, electrically conductive fabric tape typical of the prior art and is discussed elsewhere herein. As FIG. 1 illustrates, a conductive fabric tape of the prior art uses a fabric layer 115 with a roughness that can lead to isolation of conductive particles (such as particles 130a) in a substantially insulative adhesive 120 such that they do not contribute to the overall conduction of the fabric tape, leading to conductive fabric tapes with low performance.

Figure 2:
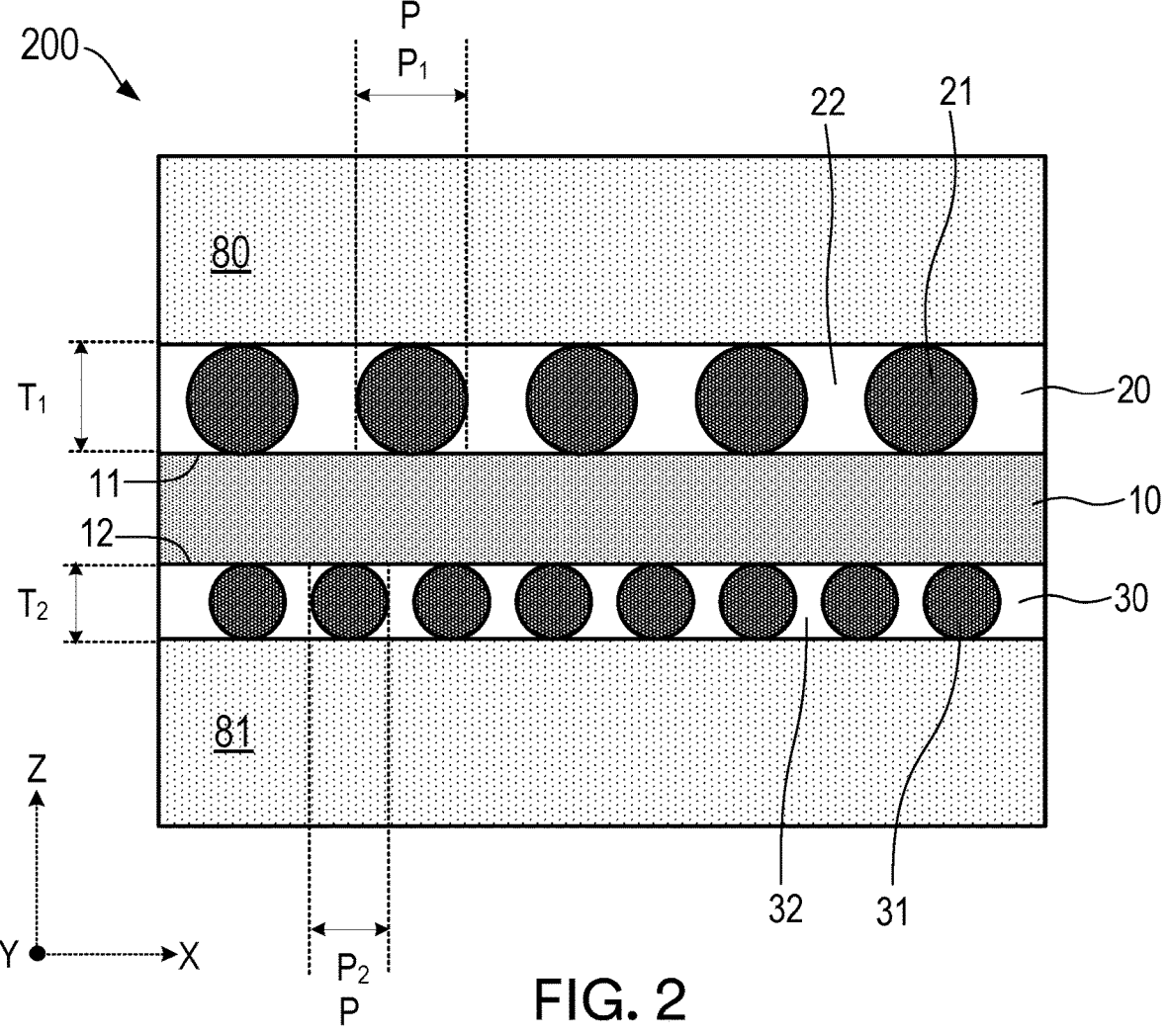
FIG. 2 is a side view of an electrically conductive bonding tape, in accordance with an embodiment of the present description.

FIG. 2 is a side view of an embodiment of an electrically conductive bonding tape, according to the present description. To maximize the rate of conduction, an electrically conductive bonding tape 200 includes an electrically conductive first film 10 (e.g., a substantially flat conductive fabric) sandwiched between, and bonded to, an electrically conductive first adhesive layer 20 and an electrically conductive second adhesive layer 30. In some embodiments, each of the first film 10 and the first 20 and second 30 adhesive layers may be electrically conductive at least along a thickness direction (e.g., in the z-axis as shown in FIG. 2) of the bonding tape 200.

In some embodiments, each of the first 20 and second 30 adhesive layers may include a plurality of electrically conductive particles 21, 31 dispersed substantially as a single layer in a substantially electrically insulative adhesive material 22, 32. In some embodiments, each of the particles in the plurality of electrically conductive particles 21, 31 in each of the first 20 and second 30 adhesive layers has a size P (e.g., $P_1$ for first adhesive layer 20 and $P_2$ for second adhesive layer 30) such that the size of particles P is substantially consistent throughout a particular layer. For example, finding the average particle size for all of the particles 21 in first adhesive layer 20 can be $P_{av}$ and the standard of deviation for the size of all particles 21 in first adhesive layer 20 can be $P_{sd}$. In some embodiments, then, the ratio $P_{sd}/P_{av}$ may be less than about 0.2, or less than about 0.17, or less than about 0.15, or less than about 0.12, or less than about 0.1. This same condition may be true for all of the particles 31 in second adhesive layer 30. That is, particles 31 in second adhesive layer 30 may have a different average particle size than particles 21 in first adhesive layer 20, but for the particles 31 throughout second adhesive layer 30, the ratio $P_{sd}/P_{av}$ may also be less than about 0.2, or less than about 0.17, or less than about 0.15, or less than about 0.12, or less than about 0.1.

In some embodiments, each of the first 20 and second 30 adhesive layers may have a thickness measured in the z-axis (as shown in FIG. 2) $T_1$ and $T_2$, respectively, such that each layer has an average thickness of no more than about 15%, or 12.5%, or 10%, or 7.5%, or 5%, or 2.5%, or 2%, or 1% greater than the average particle size Pay of the particles in the respective adhesive layer. That is, the thicknesses of the first 20 and second 30 adhesive layers may not be significantly larger than the diameter or the particles.

In some embodiments, the average surface roughness of each of opposing major first 11 and second 12 surfaces of first film 10 may be less than about 10 microns, or less than about 9 microns, or less than about 8 microns, or less than about 7 microns, or less than about 6 microns, or less than about 5 microns, or less than about 4 microns, or less than about 3 microns, or less than about 2 microns, or less than about 1 micron.

By ensuring the relative flatness of the first film 10 and a consistent particle size for electrically conductive particles 21, 31, and by keeping the average thickness of the adhesive layers close to the average particle size, the electrically conductive bonding tape 200 will show a significant improvement in electrical conduction over typical fabric tapes of the prior art.

In some embodiments, the electrically conductive first film 10 and the electrically conductive first 20 and second 30 adhesive layers, in combination, may be disposed between, and releasably attached to, first 80 and second 81 release liners. That is, additional layers such as one or more release liners may be included to protect the bonding tape 200 during handling and transfer.

Figure 3:
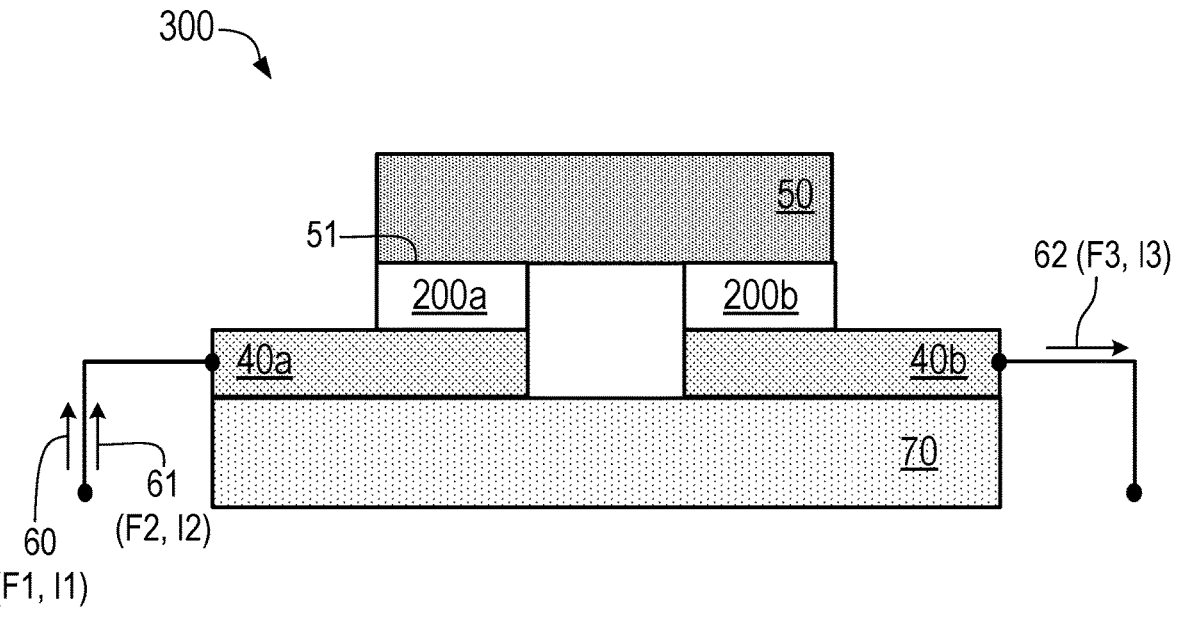
FIG. 3 is a side view of an electrical circuit including the electrically conductive bonding tapes of FIG. 2, in accordance with an embodiment of the present description.

FIG. 3 is a side view of an embodiment of an electrical circuit including the electrically conductive bonding tapes such as that shown in FIG. 2. The electrical circuit 300 may include spaced-apart first 40a and second 40b gold microstrips, a stainless steel plate 50, and a first electrically conductive bonding tape 200a and a second electrically conductive bonding tape 200b. In some embodiments, the electrical circuit 300 may be formed by providing the spaced-apart first 40a and second 40b gold microstrips, placing the stainless steel plate 50 above and in contact with the first 40a and second 40b gold microstrips, and disposing the first 200a and second 200b electrically conductive bonding tapes between the stainless steel plate 50 and the first 40a and second gold 40b microstrips, so that the first 200a and second 200b electrically conductive bonding tapes bond a same major surface 51 of stainless steel plate 50 to the respective first 40a and second 40b gold microstrips. In some embodiments, each of the first 200a and second 200b electrically conductive bonding tapes may be narrower (e.g., in at least the x-axis shown in FIG. 3) than the respective first 40a and second 40b gold microstrips by at least 10%, or at least 20%, or at least 50%, or at least 75%, or at least 100%.

In some embodiments, when first 60 and second 61 electric current signals having substantially equal respective intensities I1 and I2 and respective different frequencies F1 and F2 are simultaneously applied to the first gold microstrip 40a, then an intermodulation current signal 62 having a frequency F3 equal to nF1+mF2 with m and n being non-zero positive or negative integers, may be transmitted by the second gold microstrip 40b having an intensity I3.

In some embodiments, after repeatedly cycling the electrical circuit 300 between a lower temperature of no more than about zero degrees, or about −5 degrees, or about −10 degrees, or about −15 degrees, or about −20 degrees centigrade and a higher temperature of no less than about degrees, or no less than about 45 degrees, or no less than about 50 degrees, or no less than about 55 degrees, or no less than about 60 degrees centigrade for at least 50 hours, or at least 60 hours, or at least 70 hours, I3 may change by less than about 30 dB, or less than about 25 dB, or less than about 20 dB. In some embodiments, the electrical circuit may be cycled between the lower temperature and the higher temperature for at least 20 cycles, or at least 25 cycles, or at least cycles. In some embodiments, each cycle may be at least 80 minutes, or at least 90, or at least 100 minutes, or at least 110 minutes, or at least 120 minutes in duration. In some embodiments, each cycle may be defined as about 70 minutes, or about 80 minutes, or about 90 minutes from the higher temperature down to the lower temperature, about 15 minutes, or about 18 minutes, or about 20 minutes dwell time at the lower temperature, about 10 minutes, or about 12 minutes, or about 15 minutes from the lower temperature back to the higher temperature, and about 15 minutes, or about 18 minutes, or about 20 minutes dwell time at the higher temperature.

In some embodiments, after holding the electrical circuit 300 at a temperature of about 85 degrees centigrade at a relative humidity of 85% for at least 50 hours, or at least 60 hours, or at least 70 hours, I3 may change by less than about 30 dB, or less than about 25 dB, or less than about 20 dB.

In some embodiments, the first 40a and second 40b gold microstrips may be disposed on an electrically insulative common substrate 70.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

Terms such as "substantially" will be understood in the context in which they are used and described in the present description by one of ordinary skill in the art. If the use of "substantially equal" is not otherwise clear to one of ordinary skill in the art in the context in which it is used and described in the present description, "substantially equal" will mean about equal where about is as described above. If the use of "substantially parallel" is not otherwise clear to one of ordinary skill in the art in the context in which it is used and described in the present description, "substantially parallel" will mean within 30 degrees of parallel. Directions or surfaces described as substantially parallel to one another may, in some embodiments, be within 20 degrees, or within 10 degrees of parallel, or may be parallel or nominally parallel. If the use of "substantially aligned" is not otherwise clear to one of ordinary skill in the art in the context in which it is used and described in the present description, "substantially aligned" will mean aligned to within 20% of a width of the objects being aligned. Objects described as substantially aligned may, in some embodiments, be aligned to within 10% or to within 5% of a width of the objects being aligned.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed:

1. An electrically conductive bonding tape comprising an electrically conductive first film sandwiched between, and bonded to, electrically conductive first and second adhesive layers, each of the first film and the first and second adhesive layers electrically conductive at least along a thickness direction of the bonding tape, each of the first and second adhesive layers comprising a plurality of electrically conductive particles dispersed substantially as a single layer in a substantially electrically insulative adhesive material, the plurality of electrically conductive particles in each of the first and second adhesive layers having an average particle size $P_{av}$ and a standard of deviation $P_{sd}$, $P_{sd}/P_{av}$ less than about 0.2, each of the first and second adhesive layers having an average thickness of no more than about 15% greater than the average particle size of the particles in the adhesive layer, wherein, an average surface roughness of each of opposing major first and second surfaces of the first film is less than about 10 microns.

2. The electrically conductive bonding tape of claim 1, wherein the first film comprises an electrically conductive fabric.

3. The electrically conductive bonding tape of claim 2, wherein the electrically conductive fabric comprises a plurality of woven electrically conductive fibers.

4. The electrically conductive bonding tape of claim 2, wherein the electrically conductive fabric comprises a plurality of non-woven electrically conductive fibers.

5. The electrically conductive bonding tape of claim 1, wherein the pluralities of electrically conductive particles in the first and second adhesive layers have average particle sizes that are within 15% of each other.

6. The electrically conductive bonding tape of claim 1, wherein the pluralities of electrically conductive particles in the first and second adhesive layers have average particle sizes that are different by at least 15%.

7. The electrically conductive bonding tape of claim 1, wherein the particles in each of the pluralities of electrically conductive particles in the first and second adhesive layers comprises one or more of silver, gold, aluminum, and nickel.

8. The electrically conductive bonding tape of claim 1, wherein the average thickness of each of the first and second adhesive layers is within about 15% of the average particle size of the particles in the adhesive layer.

9. The electrically conductive bonding tape of claim 1, wherein the average thickness of each of the first and second adhesive layers is less than the average particle size of the particles in the adhesive layer.

10. An electrical circuit, wherein the electrical circuit is formed by:

providing spaced apart first and second gold microstrips;

placing a same stainless steel plate above the first and second gold microstrips; and disposing a first electrically conductive bonding tape of claim 1 and a second electrically conductive bonding tape of claim 1 between the stainless steel plate and the first and second gold microstrips, so that the first and second electrically conductive bonding tapes bond a same major surface of the stainless steel plate to the respective first and second gold microstrips; and first and second electric current signals having substantially equal respective intensities I1 and I2 and respective different frequencies F1 and F2 are simultaneously applied to the first gold microstrip, then an intermodulation current signal having a frequency F3 equal to nF1+mF2 with m and n being non-zero positive or negative integers, is transmitted by the second gold microstrip having an intensity I3, such that after repeatedly cycling the electrical circuit between a lower temperature of no more than about zero degree centigrade and a higher temperature of no less than about 40 degrees centigrade for at least 50 hours, I3 changes by less than about 30 dB.

11. The electrical circuit of claim 10, wherein when the electrical circuit is cycled between the lower temperature and the higher temperature for at least 25 cycles, each cycle being at least 100 minutes in duration, I3 changes by less than about 30 dB.

12. The electrical circuit of claim 11, wherein each cycle is defined as about 80 minutes from the higher temperature down to the lower temperature, about 18 minutes dwell time at the lower temperature, about 12 minutes from the lower temperature back to the higher temperature, and about 18 minutes dwell time at the higher temperature.

13. The electrical circuit of claim 10, wherein when the electrical circuit is held at a temperature of about 85 degrees centigrade at a relative humidity of 85% for at least 50 hours, I3 changes by less than about 30 dB.

14. The electrical circuit of claim 10, wherein the first and second gold microstrips are disposed on an electrically insulative common substrate.

15. The electrical circuit of claim 10, wherein each of the first and second electrically conductive bonding tapes of claim 10 is narrower than the respective first and second gold microstrips by at least 10%.

16. The electrical circuit of claim 10, wherein each of the first and second electrically conductive bonding tapes are substantially the same width as the respective first and second gold microstrips.

17. The electrically conductive bonding tape of claim 1, wherein when the electrically conductive bonding tape is bonded to a major surface of a stainless steel plate, the bonding tape forms a resistive contact with the stainless steel plate with a resistance value that changes by less than about 200% after repeatedly cycling the bonding tape and the stainless steel plate both between a lower temperature of no more than about zero degrees centigrade and a higher temperature of no less than about 40 degrees centigrade for at least 50 hours.

18. The electrically conductive bonding tape of claim 17, wherein when the bonding tape and the stainless steel plate are cycled between the lower temperature and the higher temperature for at least 25 cycles, each cycle being at least 100 minutes in duration, the resistance value changes by less than about 200%.

19. The electrically conductive bonding tape of claim 18, wherein each cycle is defined as about 80 minutes from the higher temperature down to the lower temperature, about 18 minutes dwell time at the lower temperature, about 12 minutes from the lower temperature back to the higher temperature, and about 18 minutes dwell time at the higher temperature.

20. The electrically conductive bonding tape of claim 1, wherein when the electrically conductive bonding tape is bonded to a major surface of a stainless steel plate, the bonding tape forms a resistive contact with the stainless steel plate with a resistance value that changes by less than about 200% after holding the bonding tape and the stainless steel plate at a temperature of about 85 degrees centigrade at a relative humidity of 85% for at least 50 hours.

\* \* \* \* \*